United States Patent
Atkins et al.

(10) Patent No.: US 7,734,132 B2
(45) Date of Patent: Jun. 8, 2010

(54) OPTICAL SPECTRAL FILTERING AND DISPERSION CONTROL FOR WAVELENGTH MULTIPLEXED LASER SOURCES USING FIBER BRAGG GRATINGS

(75) Inventors: Robert G. Atkins, Poughkeepsie, NY (US); Harry H. Bagheri, Poughkeepsie, NY (US); Casimer M. DeCusatis, Poughkeepsie, NY (US); Lawrence Jacobowitz, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 285 days.

(21) Appl. No.: 11/780,544

(22) Filed: Jul. 20, 2007

(65) Prior Publication Data

US 2009/0022181 A1    Jan. 22, 2009

(51) Int. Cl.
*G02B 6/26* (2006.01)
*G02B 6/34* (2006.01)
*G02B 6/42* (2006.01)
*H01S 3/30* (2006.01)

(52) U.S. Cl. .................... 385/31; 385/37; 372/6

(58) Field of Classification Search .......... 385/31, 385/37; 372/6
See application file for complete search history.

(56) References Cited

U.S. PATENT DOCUMENTS 5,680,489 A * 10/1997 Kersey ...................... 385/12
6,041,070 A * 3/2000 Koch et al. ................. 372/6
7,512,291 B2 * 3/2009 Mendoza .................. 385/12
2009/0168815 A1 * 7/2009 Salin et al. ................. 372/6

OTHER PUBLICATIONS

Hill, et al., "Fiber Bragg Grating Technology Fundamentals and Overview," Journal of Lightwave Technology, vol. 15, No. 8, Aug. 1997, pp. 1263-1276.
K. Hill, Chapter 9 in the Handbook of Optics, vol. 4, Second Edition, Published by the Optical Society of America, 2004, pp. 9.1-9.11.
Optics Letters, Aug. 15, 2006, pp. 2417.

* cited by examiner

*Primary Examiner*—Daniel Petkovsek
(74) *Attorney, Agent, or Firm*—Gibb I.P. Law Firm, LLC

(57) ABSTRACT

The embodiments of the invention provide an apparatus for optical spectral filtering and dispersion control for wavelength multiplexed laser sources using fiber Bragg gratings. More specifically, the apparatus includes a laser diode having a first end and a second end opposite the first end. The first end of the laser diode has a first semi-transparent portion; and, the second end of the laser diode has a second semi-transparent portion. The apparatus further includes an optical fiber connected to the second end of the laser diode. The optical fiber has a first end and a second end opposite the first end, wherein the first end of the optical fiber is connected to the second end of the laser diode. The laser diode comprises a laser cavity; and, the optical fiber comprises an extension of the laser cavity. Moreover, the second end of the optical fiber has a reflective surface.

20 Claims, 4 Drawing Sheets

OPTICAL SPECTRAL FILTERING AND DISPERSION CONTROL FOR WAVELENGTH MULTIPLEXED LASER SOURCES USING FIBER BRAGG GRATINGS

BACKGROUND

1. Field of the Invention

The embodiments of the invention generally relate to optical spectral filtering and dispersion control for wavelength multiplexed laser sources using fiber Bragg gratings.

2. Description of the Related Art

Implementing frequency control of semiconductor lasers is performed in order to produce a low cost optical communication source which complies with industry requirements for extended distance support at data rates of 4 Gbits/s or higher. While previous techniques for implementing frequency control of semiconductor lasers works well for laser diodes operating at standard communication wavelengths near 1300 nm or 850 nm (with suitable variations to manage the different wavelength ranges), they are not applicable for wavelengths in the 1550 nm wavelength band used in standard coarse and dense wavelength division multiplexing (WDM). The semiconductor amplifiers do not operate for these wavelengths, so it is not possible to use them for spectral filtering.

SUMMARY

The embodiments of the invention provide an apparatus for optical spectral filtering and dispersion control for wavelength multiplexed laser sources using fiber Bragg gratings. More specifically, the apparatus includes a laser diode having a first end and a second end opposite the first end. The first end of the laser diode has a first semi-transparent portion; and, the second end of the laser diode has a second semi-transparent portion.

The apparatus further includes an optical fiber connected to the second end of the laser diode. The optical fiber has a first end and a second end opposite the first end, wherein the first end of the optical fiber is connected to the second end of the laser diode. The laser diode comprises a laser cavity; and, the optical fiber comprises an extension of the laser cavity. Moreover, the second end of the optical fiber has a reflective surface.

Thus, light emitted from the laser diode enters through the first end of the optical fiber, reflects off of the second end of the optical fiber, and enters the laser diode through the first end of the optical fiber.

A filter is also provided within the optical fiber, wherein the filter includes a plurality of filter cores having differing refractive indexes. The filter cores comprise differing materials and/or differing sizes. Thus, first wavelengths of light are transmitted through the filter cores; and, second wavelengths of light are reflected by the filter cores.

Furthermore, the apparatus includes a filtering controller operatively connected to the optical fiber and an optical sensor operatively connected to the filtering controller. The optical sensor has a wavelength monitor, an analysis engine, and a feedback transmitter.

The embodiments of the invention provides an optical spectral filtering solution for wavelengths in the 1550 nm wavelength band used in standard coarse and dense WDM. Specifically, a tunable fiber Bragg grating is integrated with the back facet of the laser diode. This forms a resonant coupled cavity structure which can be tuned to pass or reject the desired optical frequency components.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
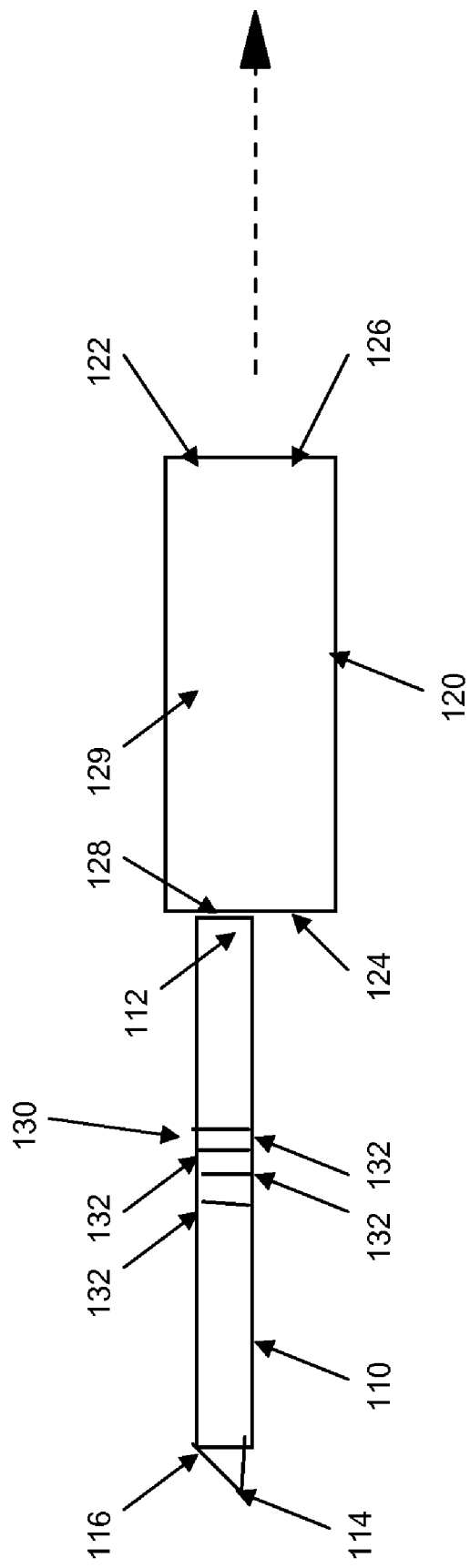
FIG. 1 is a diagram illustrating an optical fiber connected to a laser diode.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The embodiments of the invention provides an optical spectral filtering solution for wavelengths in the 1550 nm wavelength band used in standard coarse and dense WDM. Specifically, a tunable fiber Bragg grating is integrated with the back facet of the laser diode. This forms a resonant coupled cavity structure which can be tuned to pass or reject the desired optical frequency components.

The benefits for being able to tune the spectral content of lasers in the 1550 nm wavelength regime apply to both dedicated optical transceivers, such as may be used on fiber connectivity (FICON) or Fibre Channel links, and to various types of wavelength multiplexers. WDM and Dense Wavelength Division Multiplexing (DWDM) are optical communication technologies that enable multiple wavelengths (colors of light) to be transmitted in parallel within the same optical fiber, with each wavelength potentially assigned its own data pattern. Currently, WDM and DWDM products combine many different data links over a single pair of optical fibers by re-modulating the data onto a set of lasers, which are tuned to a very specific wavelength (within 0.8 nm tolerance, following industry standards). On current products, up to 32 wavelengths of light can be combined over a single fiber link with more wavelengths contemplated for future applications. The wavelengths are combined by passing light through a series of optical filters, which consist of multi-layer coatings on a glass substrate, pigtailed with optical fibers. The filters combine multiple wavelengths into a single fiber path, and also separate them again at the far end of the multiplexed link. Filters may also be used at intermediate points to add or drop wavelength channels from the optical network. The embodiments of the invention provide spectral control of the individual lasers that comprise a WDM or DWDM network, so that their spectral content is better matched to the properties of an optical fiber and thus minimizes dispersion over long distances. It may also be possible to place center wavelengths closer together and thereby increase the information carrying capacity of the network.

Basically, a fiber Bragg grating consists of a short section of optical fiber that has been slightly modified to have a periodic variation in its refractive index. To form the gratings, the optical fiber core is exposed to ultraviolet radiation in a regular pattern, which results in the refractive index of the fiber core being altered according to that regular pattern. If the fiber is then heated or annealed for a few hours, the index changes become permanent. As described in K. Hill, Fiber Bragg Gratings, Chapter 9 in Handbook of Optics vol. IV, OSA Press (2000) and, B. Poumellec, P. Niay, M. Douay et al., "The UV induced Refractive Index Grating in Ge: SiO2 Preforms: Additional CW experiments and the macroscopic origins of the change in index", Journal Of Physics D, App. Phys. Vol. 29, p. 1842-1856 (1996), this phenomena is known as "photosensitivity." It is understood that the magnitude of the index change may depend upon many factors including: the irradiation wavelength, intensity, and total dose, the composition and doping of the fiber core, and any materials processing done either prior or subsequent to irradiation. For example, in germanium-doped single mode fibers, index differences between $10^{-3}$ and $10^{-5}$ are achievable. Using this effect, periodic diffraction gratings can be written in the core of an optical fiber. Typically, the exposure is carried out using an interferometer or, through a phase mask with a periodic structure that permits writing of a periodically varying refractive index grating within the photorefractive media within the core. The reflectivity, bandwidth and central wavelength of such a Bragg structure are generally defined by the period and length of the phase mask and exposure time used.

Light traveling through these refractive index changes of optical fiber core having a fiber Bragg grating is reflected back, with a maximum reflection usually occurring at one particular wavelength known as the "Bragg wavelength". That is, such gratings reflect light in a narrow bandwidth centered around the Bragg wavelength, which is proportional to the spatial period, or pitch, of the periodic index variations and the effective refractive index for light propagating in the fiber core. Thus, the wavelength of light reflected back depends on the amount of refractive index change that has been applied and also on how distantly spaced the refractive index changes are. If the spacing of the Bragg planes is varied across the length of the grating, it is possible to produce a chirped grating, in which different wavelengths can be considered to be reflected from different points along the grating. By superimposing gratings of different periods, and gratings with variable or chirped periods, it is possible to design fiber Bragg gratings which tailor the reflected light profile by only reflecting specific frequency components. Furthermore, it is possible to re-write fiber Bragg gratings using various schemes, some of which work in real time; these include photorefractive or photochemically induced schemes, or electrorefractive schemes. For example, electrically switchable fiber Bragg Grating filter devices have been produced. Tunable fiber Bragg gratings provide the means to change the grating period in response to external electrical or optical signals.

Figure 2:
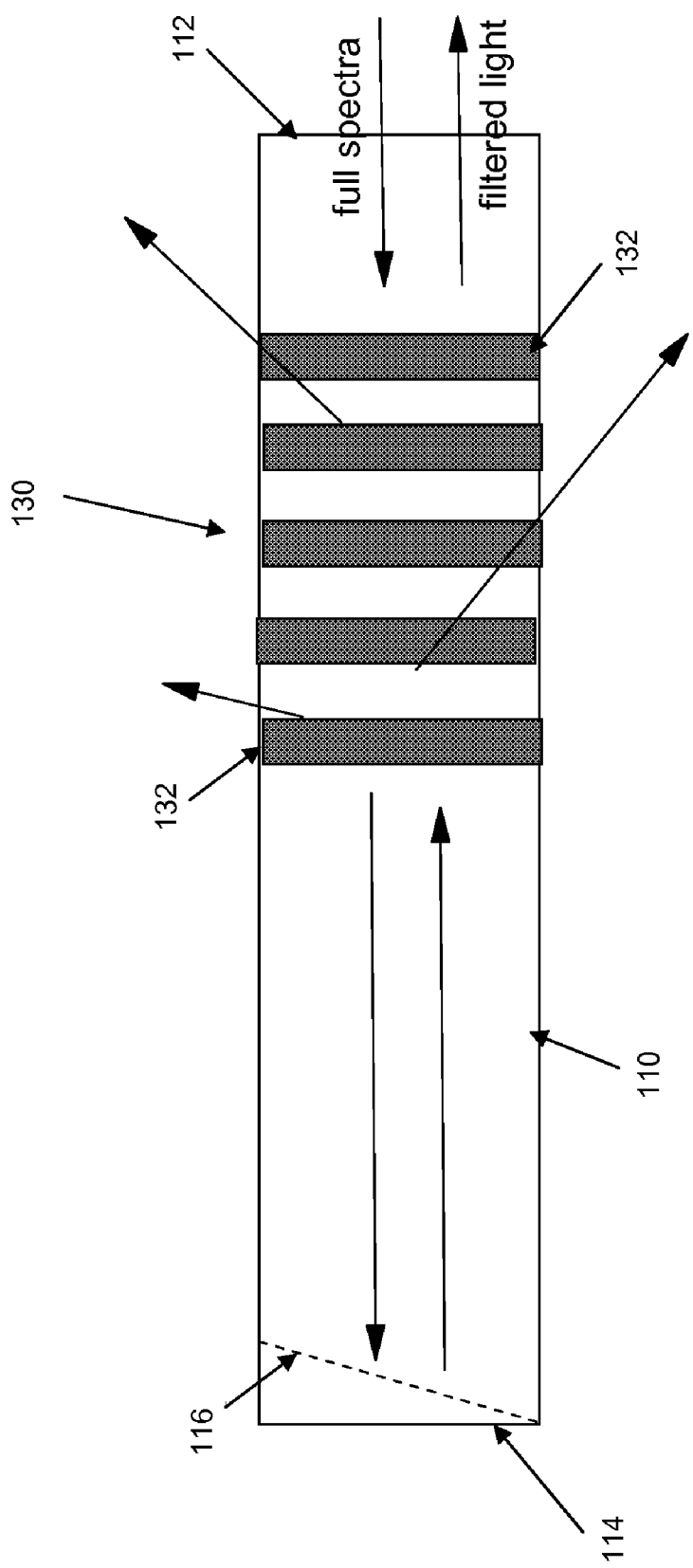
FIG. 2 is a diagram illustrating an optical fiber having a fiber Bragg grating.

As noted above, fiber Bragg gratings are well known in the industry, and can be manufactured using a variety of methods. The basic principle involved producing a periodic variation in the refractive index of an optical fiber's core; this acts like a phase diffraction grating. By adjusting the period of this grating, it becomes possible to selectively reflect or transmit different wavelengths of light. The embodiments herein propose integrating a fiber Bragg grating with the rear facet of a laser diode operating in the 1550 nm range. As illustrated in FIGS. 1 and 2, an optical fiber 110 is connected to a rear end of a laser diode 120. The optical fiber 110 includes a Bragg grating 130 and a polished endface 116. Thus, the front end of the laser diode 120 transmits frequency controlled output light.

In a conventional solid state laser, the rear facet of the laser cavity would simply reflect light; combined with the front mirror, this would form an optical resonant cavity which is an integral number of wavelengths in length (also known as a Fabry-Perot laser). In the laser diode 120, the rear facet is made partially transparent, and light is coupled into the optical fiber 110 which contains the Bragg grating 130. The period of this grating is tuned to reflect only the desired wavelength components; multiple gratings can be superimposed in the same fiber to define a desired spectral profile. The far end of the optical fiber (i.e., the endface 116) is polished, and coated with thin films to act as a mirror. The fiber Bragg grating 130 thus forms an extension of the laser cavity. However, since the fiber Bragg grating 130 only reflects specific frequency components, it follows that only those selected frequencies will be amplified by the laser. By controlling the period of the fiber Bragg grating 130, the output spectra can be adjusted as desired to minimize dispersion and similar effects.

Figure 3:
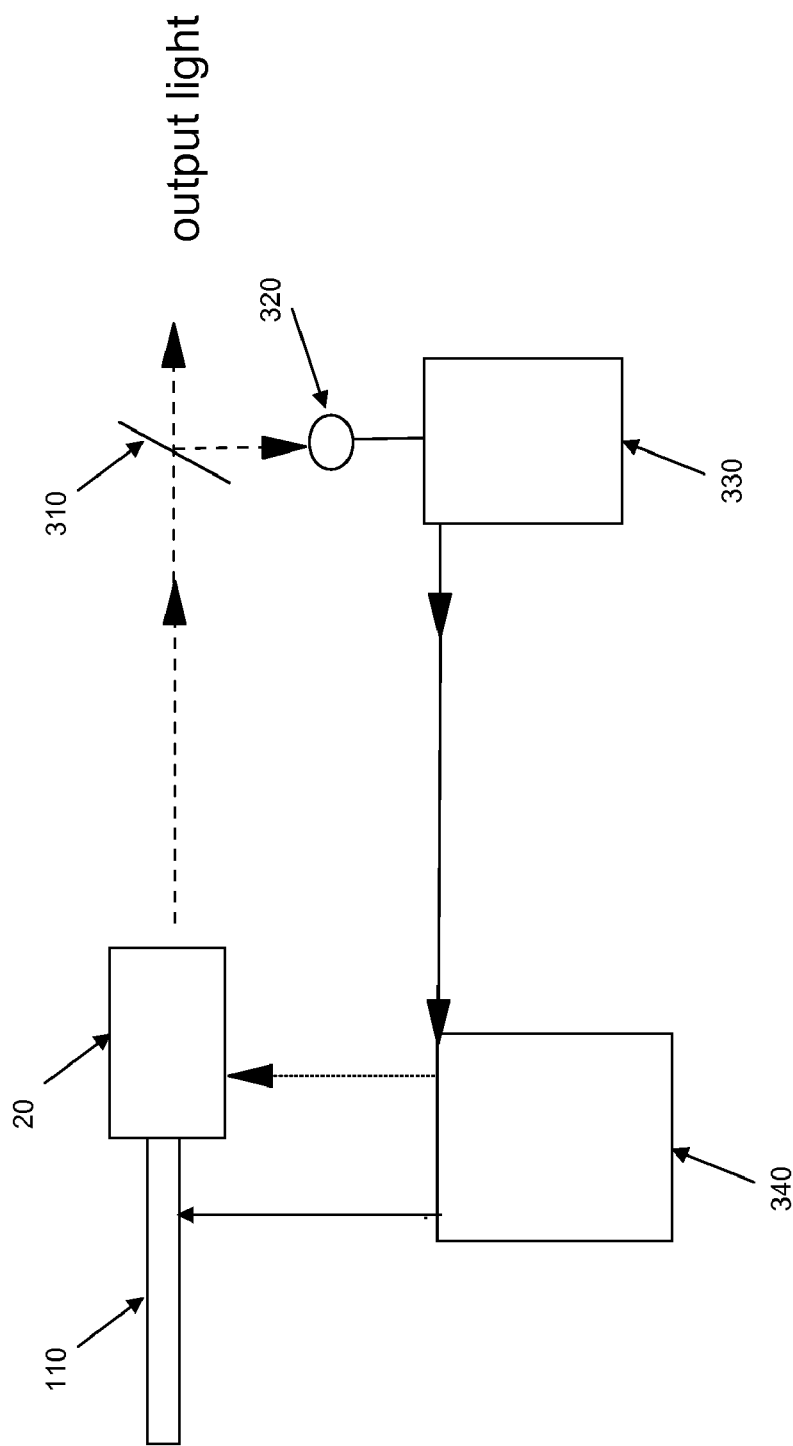
FIG. 3 is a diagram illustrating a feedback loop system.

One embodiment of the invention uses a fixed period Bragg grating, which is designed to match the desired wavelength profile of an optical fiber. When this is integrated with a semiconductor laser diode, then only the desired frequency components will emerge from the laser for communication purposes. This approach does not affect other digital modulation properties of the laser, and is also applicable to different laser structures (Fabry-Perot, distributed feedback lasers, etc). Another embodiment uses a tunable fiber Bragg grating to adjust the output wavelengths dynamically in response to an external signal, for example a feedback signal derived from optically sampling the laser output. This allows the system to adjust in response to changes in temperature, external applied voltage, or other environmental variables. In this case, as illustrated in FIG. 3, the output light from the laser diode 120 is sampled with a beamsplitter 310, than a photodiode 320 converts the optical signal into an electrical signal. This signal may be amplified or otherwise processed by an electronic circuit (e.g., the monitor circuit 330), then it is fed back to control properties (e.g., the control circuit 340) of the Bragg grating (for example, the electrically tunable properties if the grating is made from an electroactive material, or thermal properties if the grating is placed on a thermoelectric heater/cooler). Many possible feedback control variables may be implemented using this scheme. Both of these embodiments are non-intuitive, since conventional approaches to wavelength control do not involve using optical fibers to extend the laser cavity (the fiber itself provides no gain). However, an advantage of this approach is that if stronger filtering is required, a fairly long piece of fiber can be used, enabling much longer period gratings and more complex superposition patterns for finer wavelength control (the figures illustrate a short, straight piece of fiber, however the actual fiber can be several inches to several feet in length, coiled behind the laser diode to form a rugged, compact package).

While the concept of integrating a Bragg grating with the diode laser back facet is workable, there are some practical issues. In order to couple sufficient light (mW) into the external-coupled cavity, the rear laser facet transmission must be high enough to allow a signal through the grating structure and reflect back to the internal cavity. There will be a coupling interaction between the Bragg grating and the internal laser cavity which may generate a perturbation to the laser. If all the transmittances and efficiencies are adequate, perturbation minimal, and, the laser cavity reflector distances are temperature-compensated, the spectral filtering is workable. This approach is workable through some simple calculations.

Within this application several publications are referenced by arabic numerals within brackets. Full citations for these, and other, publications may be found at the end of the specification immediately preceding the claims. The disclosures of all these publications in their entireties are hereby expressly incorporated by reference into the present application for the purposes of indicating the background of the present invention and illustrating the state of the art.

Light propagating through the Bragg grating is scattered by Fresnel reflection from each successive refractive index perturbation in the fiber core; a periodic index perturbation with period P will cause high transmissivity in the vicinity of the Bragg wavelength, defined as $$\lambda_B = 2nP$$

Where n is the effective modal index of the fiber core. The light efficiency can approach 100% within 1 nm or so around the Bragg wavelength [1]. The transmission functions of a fiber Bragg grating can be described theoretically using coupled mode equations [2]. For a grating with sinusoidal perturbations of constant amplitude, A, the grating transmission is determined by the following factors:

the grating coupling coefficient, $K = A \pi/\lambda$
the mode propagation constant, $B = 2 n \pi/\lambda$
the grating length, L At the Bragg wavelength, the grating transmissivity [1, 2] is given by $T = \tan h^2 (KL)$. Assuming a Bragg wavelength in the 1550 nm wavelength band and using typical values for the grating amplitude and modal index yields the product (KL)=3, which results in a transmissivity of around 99%. In the case of a strong grating such as this, it can be shown from coupled mode theory [2] that the spectral full width at half maximum of the grating is given by $$\Delta\lambda = 4\lambda_B^2 K/\pi$$

or around 0.3 nm in our case. This is sufficient for our wavelength filtering applications, since the spacing between consecutive spectral peaks in the International Telecommunications Union (ITU) standard is defined as 0.8 nm minimum, and commercial products are available which implement spacings of 1.6 nm to 3.2 nm. Embodiments herein can thus function as an effective spectral filter in these applications.

The Bragg grating transmission function is essentially a square wave with this spectral width; sidelobes in the transfer function can be controlled by slightly blazing the Bragg grating (1-2 degrees off the fiber optic axis reduces the first order sidelobe to less than 15% of the peak amplitude). The optical power emerging from the rear facet of a typical laser diode can be on the order of 1-2%, which yields a fairly low optical power for the tuned spectra. This can be overcome in several ways. Increasing the rear facet transmissivity is one approach, though care must be taken not to destabilize the laser cavity; this may be suitable only for low power applications. Alternately, if the fiber Bragg grating is not closely coupled to the laser resonant cavity, wavelength filtering can still be achieved without affecting the laser stability. This latter approach can be used to generate a control signal to stabilize the laser output spectra at significantly higher optical power levels. [3] describes the use of a bulk, volume reflection grating (not a fiber Bragg grating) placed externally to a Fabry-Perot etalon cavity and laser combination (not coupled to the cavity but optically aligned in front of the laser front facet). This demonstrates in principle that a diffraction grating can be used to select transmission lines of a laser to within less than 1 nm (per the International Telecommunication Union standards). While this validates our above calculations, it does not anticipate the novelty of our invention, and does not describe either the back facet coupling, the use of fiber Bragg gratings, or any of our feedback loop concepts.

How well the device structure works depends on facet reflectivity coefficients, Bragg grating efficiency and stability of internal and external coupling, ultimately determining the filtering characteristic curve, including filter bandwidth relative to the laser bandwidth and center wavelength. In general, laser facets have finesse to keep external quantum efficiency high, so reducing the rear facet reflectivity may not be desirable, but is necessary for the Bragg grating to return sufficient optical power to be able to sense and close a circuit loop for stability control. The preferred embodiment for best practice would be to decouple the Bragg Fiber Grating from the laser rear facet with a small air gap (to assure laser resonator stabilty). This also allows operation of the laser at higher operating current and greater output power, also increasing the power output from the rear laser facet.

The embodiments of the invention provide an apparatus for optical spectral filtering and dispersion control for wavelength multiplexed laser sources using fiber Bragg gratings. More specifically, as illustrated in FIG. 1, the apparatus includes a laser diode 120 having a first end 122 and a second end 124 opposite the first end 122. The first end 122 of the laser diode has a first semi-transparent portion 126; and, the second end 124 of the laser diode has a second semi-transparent portion 128. The first semi-transparent portion 126 and the second semi-transparent portion 128 each comprise an optical coating on the surface of the laser diode 120, which is designed to transmit some fraction of light at the laser operating wavelengths, while also reflecting some portion of this light back into the laser cavity.

As also illustrated in FIG. 2, the apparatus includes an optical fiber 110 connected to the second end 124 of the laser diode 120. The optical fiber 110 has a first end 112 and a second end 114 opposite the first end 112, wherein the first end 112 of the optical fiber 110 is connected to the second end 124 of the laser diode 120. The laser diode 120 comprises a laser cavity 129; and, the optical fiber 110 comprises an extension of the laser cavity 129. Moreover, the second end 114 of the optical fiber 110 has a reflective surface 116 (also referred to herein as the "endface 116"). Thus, light emitted from the laser diode 120 enters through the first end 112 of the optical fiber 110, reflects off of the second end 114 of the optical fiber 110, and enters the laser diode 120 through the first end 112 of the optical fiber 110.

A filter 130 (also referred to herein as the "Bragg grating 130") is also provided within the optical fiber 110, wherein the filter 130 includes a plurality of filter cores 132 having differing refractive indexes. The filter cores 132 comprise differing materials and/or differing sizes. Thus, first wavelengths of light are transmitted through the filter cores 132; and, second wavelengths of light are reflected by the filter cores 132. In other words, the apparatus includes a filter within the optical fiber, wherein the filter comprises a region within the optical fiber core having alternating regions of higher and lower refractive index (for example, such as a Bragg diffraction grating). As discussed above, a periodic variation can be produced in the refractive index of an optical fiber's core; this acts like a phase diffraction grating. By adjusting the period of this grating, it becomes possible to selectively reflect or transmit different wavelengths of light. The embodiments herein propose integrating a fiber Bragg grating with the rear facet of a laser diode operating in the 1550 nm range.

Figure 4:
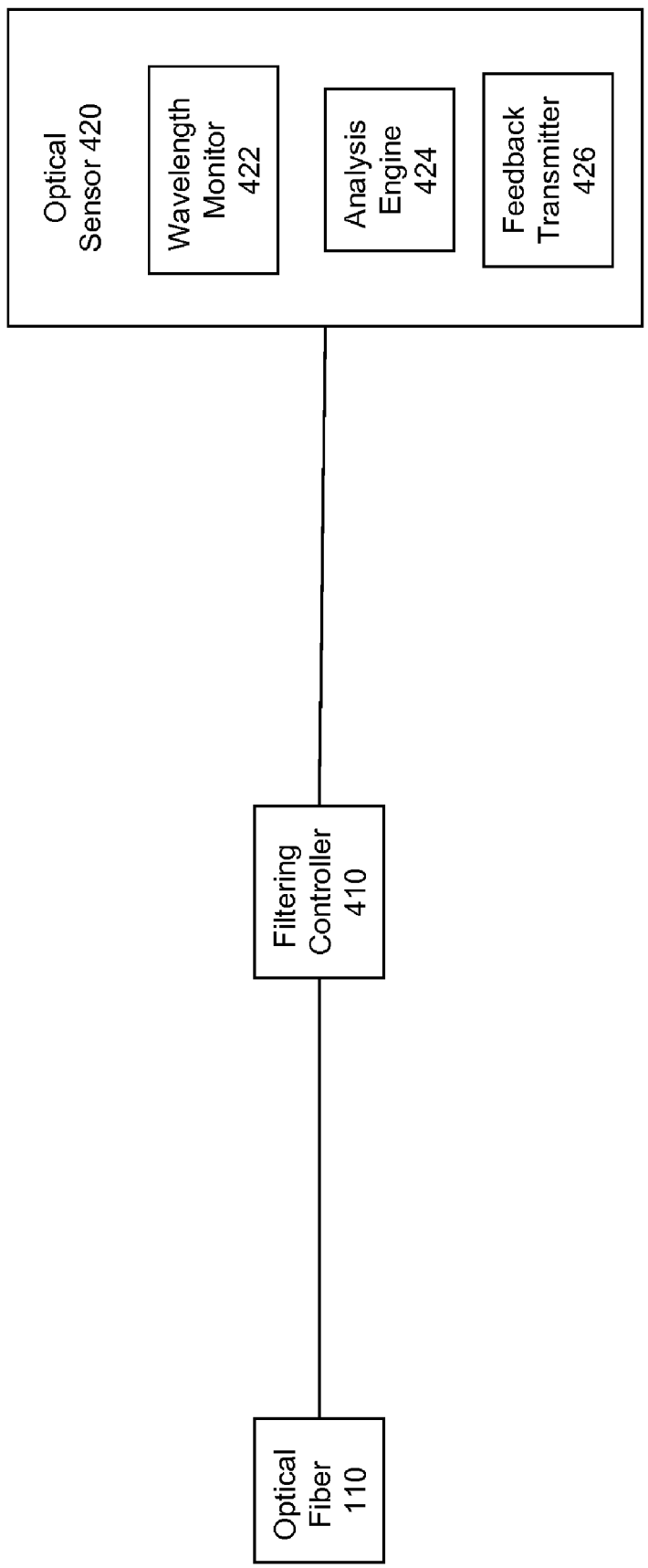
FIG. 4 is a diagram illustrating a filtering system.

Furthermore, as illustrated in FIG. 4, the apparatus includes a filtering controller 410 operatively connected to the optical fiber 110 and an optical sensor 420 operatively connected to the filtering controller 410. The optical sensor 420 has a wavelength monitor 422, an analysis engine 424, and a feedback transmitter 426. As discussed above, this allows the apparatus to adjust the output wavelengths dynamically in response to an external signal, for example a feedback signal derived from optically sampling the laser output. This allows the system to adjust in response to changes in temperature, external applied voltage, or other environmental variables.

Accordingly, the embodiments of the invention provides an optical spectral filtering solution for wavelengths in the 1550 nm wavelength band used in standard coarse and dense WDM. Specifically, a tunable fiber Bragg grating is integrated with the back facet of the laser diode. This forms a resonant coupled cavity structure which can be tuned to pass or reject the desired optical frequency components.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

REFERENCES

[1] K. Hill, chapter 9 in the Handbook of Optics vol 4, second edition, published by the Optical Society of America (pages 9.1-9.11) (2004).
[2] Journal of Lightwave Technology vol 15 no 8, p 1263 (1997).
[3] Optics Letters p 2417, Aug. 15, 2006.

What is claimed is:

1. An apparatus, comprising:
a laser diode;
an optical fiber connected to said laser diode, wherein said optical fiber comprises a first end and a second end opposite said first end, wherein said first end of said optical fiber is connected to said laser diode, and wherein said second end of said optical fiber comprises a reflective surface; and
a filter within said optical fiber, wherein said filter comprises a plurality of filter cores comprising differing refractive indexes,
wherein said optical fiber is positioned such that light emitted from said laser diode enters through said first end of said optical fiber, reflects off of said second end of said optical fiber, and re-enters said laser diode through said first end of said optical fiber wherein said light passes through and is output from said laser diode.

2. The apparatus according to claim 1, wherein said filter cores comprise at least one of differing materials and differing sizes.

3. The apparatus according to claim 1, wherein said filter cores comprise refractive indexes such that first wavelengths of light are transmitted through said filter cores, and wherein second wavelengths of light are reflected by said filter cores.

4. The apparatus according to claim 1, wherein said laser diode comprises a laser cavity, and wherein said optical fiber comprises an extension of said laser cavity, forming a resonant coupled cavity structure.

5. An apparatus, comprising:
a laser diode, wherein said laser diode comprises a first end and a second end opposite said first end;
an optical fiber connected to said second end of said laser diode, wherein said optical fiber comprises a first end and a second end opposite said first end, wherein said first end of said optical fiber is connected to said second end of said laser diode, and wherein said second end of said optical fiber comprises a reflective surface; and
a filter within said optical fiber, wherein said filter comprises a plurality of filter cores comprising differing refractive indexes,
wherein said optical fiber is positioned such that light emitted from said laser diode enters through said first end of said optical fiber, reflects off of said second end of said optical fiber, and re-enters said laser diode through said first end of said optical fiber wherein said light passes through and is output from said laser diode.

6. The apparatus according to claim 5, wherein said filter cores comprise at least one of differing materials and differing sizes.

7. The apparatus according to claim 5, wherein said filter cores comprise refractive indexes such that first wavelengths of light are transmitted through said filter cores, and wherein second wavelengths of light are reflected by said filter cores.

8. The apparatus according to claim 5, wherein said laser diode comprises a laser cavity, and wherein said optical fiber comprises an extension of said laser cavity, forming a resonant coupled cavity structure.

9. An apparatus, comprising:
a laser diode;
an optical fiber connected to said laser diode, wherein said optical fiber comprises a first end and a second end opposite said first end, wherein said first end of said optical fiber is connected to said laser diode, and wherein said second end of said optical fiber comprises a reflective surface;
a filter within said optical fiber, wherein said filter comprises a plurality of filter cores comprising differing refractive indexes;
a filtering controller operatively connected to said optical fiber; and
an optical sensor operatively connected to said filtering controller,
wherein said optical sensor comprises a wavelength monitor, an analysis engine, and a feedback transmitter, wherein said optical fiber is positioned such that light emitted from said laser diode enters through said first end of said optical fiber, reflects off of said second end of said optical fiber, and re-enters said laser diode through said first end of said optical fiber wherein said light passes through and is output from said laser diode.

10. The apparatus according to claim 9, wherein said filter cores comprise at least one of differing materials and differing sizes.

11. The apparatus according to claim 9, wherein said filter cores comprise refractive indexes such that first wavelengths of light are transmitted through said filter cores, and wherein second wavelengths of light are reflected by said filter cores.

12. The apparatus according to claim 9, wherein said laser diode comprises a laser cavity, and wherein said optical fiber comprises an extension of said laser cavity, forming a resonant coupled cavity structure.

13. An apparatus, comprising:
a laser diode, wherein said laser diode comprises a first end and a second end opposite said first end;
an optical fiber connected to said second end of said laser diode, wherein said optical fiber comprises a first end and a second end opposite said first end, wherein said first end of said optical fiber is connected to said second end of said laser diode, and wherein said second end of said optical fiber comprises a reflective surface;
a filter within said optical fiber, wherein said filter comprises a plurality of filter cores comprising differing refractive indexes;
a filtering controller operatively connected to said optical fiber; and
an optical sensor operatively connected to said filtering controller,
wherein said optical sensor comprises a wavelength monitor, an analysis engine, and a feedback transmitter
wherein said optical fiber is positioned such that light emitted from said laser diode enters through said first end of said optical fiber, reflects off of said second end of said optical fiber, and re-enters said laser diode through said first end of said optical fiber wherein said light passes through and is output from said laser diode.

14. The apparatus according to claim 13, wherein said filter cores comprise at least one of differing materials and differing sizes.

15. The apparatus according to claim 13, wherein said filter cores comprise refractive indexes such that first wavelengths of light are transmitted through said filter cores, and wherein second wavelengths of light are reflected by said filter cores.

16. The apparatus according to claim 13, wherein said laser diode comprises a laser cavity, and wherein said optical fiber comprises an extension of said laser cavity, forming a resonant coupled cavity structure.

17. An apparatus, comprising:
a laser diode, wherein said laser diode comprises a first end and a second end opposite said first end, wherein said first end comprises a first semi-transparent portion, and wherein said second end comprises a second semi-transparent portion;
an optical fiber adjacent to said second end of said laser diode, wherein said optical fiber comprises a first end and a second end opposite said first end, wherein said first end of said optical fiber is adjacent to said second end of said laser diode, wherein said second end of said optical fiber comprises a reflective surface, and wherein said optical fiber is separated from said laser diode by an air gap;
a filter within said optical fiber, wherein said filter comprises a plurality of filter cores comprising differing refractive indexes;
a filtering controller operatively connected to said optical fiber; and
an optical sensor operatively connected to said filtering controller,
wherein said optical sensor comprises a wavelength monitor, an analysis engine, and a feedback transmitter,
wherein said optical fiber is positioned such that light emitted from said laser diode enters through said first end of said optical fiber, reflects off of said second end of said optical fiber, and re-enters said laser diode through said first end of said optical fiber wherein said light passes through and is output from said laser diode.

18. The apparatus according to claim 17, wherein said filter cores comprise at least one of differing materials and differing sizes.

19. The apparatus according to claim 17, wherein said filter cores comprise refractive indexes such that first wavelengths of light are transmitted through said filter cores, and wherein second wavelengths of light are reflected by said filter cores.

20. The apparatus according to claim 17, wherein said laser diode comprises a laser cavity, and wherein said optical fiber comprises an extension of said laser cavity, forming a resonant coupled cavity structure.

* * * * *